(12) United States Patent
Vaisman

(10) Patent No.: US 11,430,752 B1
(45) Date of Patent: Aug. 30, 2022

(54) LOW COST MILLIMITER WAVE INTEGRATED LTCC PACKAGE

(71) Applicant: Scientific Components Corporation, Brooklyn, NY (US)

(72) Inventor: Aaron Vaisman, New York, NY (US)

(73) Assignee: Scientific Components Corporation, Brooklyn, NY (US)

( * ) Notice: Subject to any disclaimer, the term of this patent is extended or adjusted under 35 U.S.C. 154(b) by 0 days.

(21) Appl. No.: 17/112,604

(22) Filed: Dec. 4, 2020

Related U.S. Application Data

(62) Division of application No. 15/924,787, filed on Mar. 19, 2018, now Pat. No. 10,861,803.

(60) Provisional application No. 62/473,043, filed on Mar. 17, 2017.

(51) Int. Cl.
| | |
|---|---|
| *H01L 23/00* | (2006.01) |
| *H01L 23/13* | (2006.01) |
| *H01L 25/18* | (2006.01) |
| *H01L 23/538* | (2006.01) |
| *H01L 23/15* | (2006.01) |
| *H01L 23/66* | (2006.01) |

(52) U.S. Cl.
CPC .............. *H01L 23/66* (2013.01); *H01L 23/13* (2013.01); *H01L 23/15* (2013.01); *H01L 23/5389* (2013.01); *H01L 24/16* (2013.01); *H01L 24/48* (2013.01); *H01L 24/81* (2013.01); *H01L 25/18* (2013.01); *H01L 2223/6622* (2013.01); *H01L 2223/6627* (2013.01); *H01L 2224/16235* (2013.01); *H01L 2224/48225* (2013.01); *H01L 2224/81815* (2013.01); *H01L 2924/15153* (2013.01)

(58) Field of Classification Search
CPC ......... H01L 23/66; H01L 23/13; H01L 23/15; H01L 23/5389; H01L 24/16; H01L 24/48; H01L 24/81; H01L 25/18; H01L 2223/6622; H01L 2223/6627; H01L 2224/16235; H01L 2224/48225; H01L 2224/81815; H01L 2924/15153
See application file for complete search history.

(56) References Cited

U.S. PATENT DOCUMENTS

| | | | |
|---|---|---|---|
| 2007/0047879 A1* | 3/2007 | Park | G02B 26/0808 385/92 |
| 2016/0029487 A1* | 1/2016 | Kondo | B81C 1/00261 174/261 |
| 2016/0181169 A1* | 6/2016 | Huang | H01L 23/49894 257/772 |

* cited by examiner

*Primary Examiner* — Douglas W Owens
(74) *Attorney, Agent, or Firm* — Lawrence G. Fridman, Esq; Feigin & Fridman, LLC

(57) ABSTRACT

LTCC structure extends between top and bottom surfaces, with at least one cavity being formed within the structure and extending from the top surface inwardly in the direction of the bottom surface. A die is disposed within the cavity a top surface of the die is positioned flush with the top surface of the package, resulted in the shortest length of the wire box connecting the die with the LTCC structure and ultimately reducing the inductance.

12 Claims, 11 Drawing Sheets

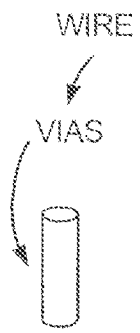
FIG. 5A
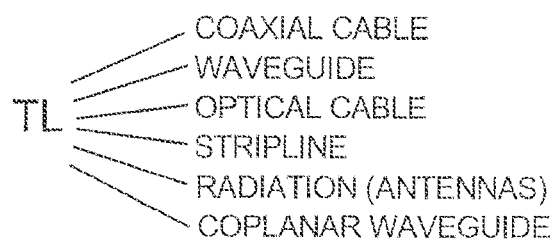
FIG. 5B
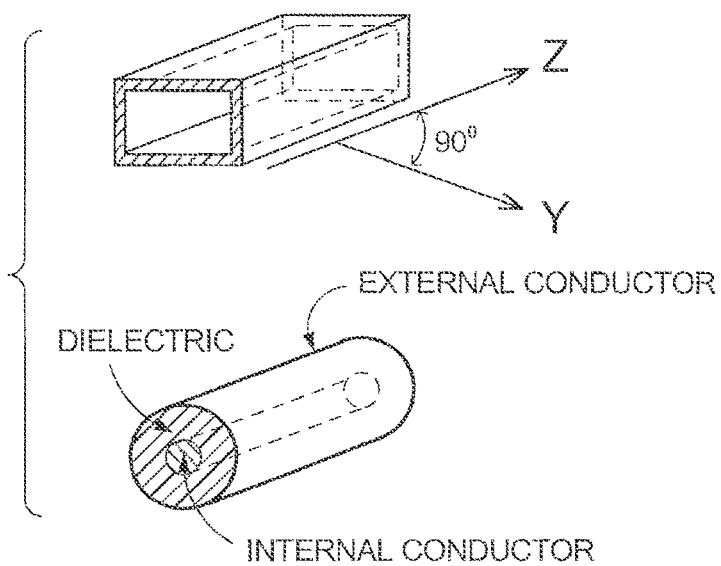
FIG. 5C
$$Z_L = jwL$$
FIG. 6
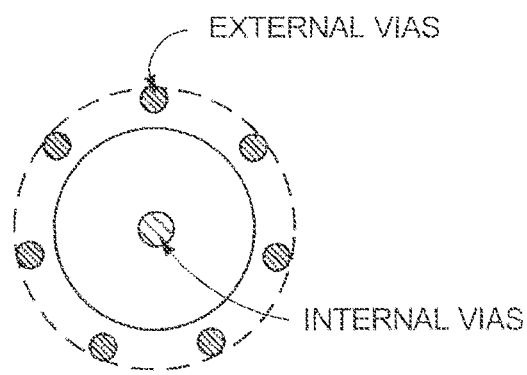
FIG. 7

LOW COST MILLIMITER WAVE INTEGRATED LTCC PACKAGE

REFERENCE TO RELATED APPLICATION

This Divisional Application claims priority of U.S. patent application Ser. No. 15/924,787 Filed Mar. 19, 2018 and U.S. Provisional Application Ser. No. 62/473,043 Filed Mar. 17, 2017, the entire disclosure of these applications is hereby incorporated by reference.

SUMMARY OF THE INVENTION

The present invention essentially provides two approaches to the formation of the low-cost millimeter wave integrated LTCC packages of the invention: (1) the wire bonding approach and (2) the approach which is based on the flip chip technology. The wire bonding approach is based on dropping the die into the cavity. This step is followed by the die being wire bonded to a surface of the package. As to the second approach, there are two aspects of the flip chip technology. To mount of the chip itself directly to the surface of the package without cavities being formed, or to drop the chip in the same way it is dropped in the wire bonded approach, i.e. dropping the flip chip version of a die, followed by re-flow for the metal contact to be soldered to the actual package. In this instance, the wire bonding technique is not required. This is because, the flip chip has already metallization bumps under it. These bumps are melted and attached to the actual landing pad built on the package itself.

BRIEF DESCRIPTION OF THE DRAWINGS

The drawings discussed below are provided to illustrate and not to limit the invention, wherein:

FIG. 5A is a diagram illustrating various approaches which can be employed to transfer the energy.

FIG. 5B is a diagram illustrating waveguides.

FIG. 5C is an illustration of the transmission line which operates in TEM mode.

FIG. 6 is a diagram illustrating advantages of using a transmission line.

FIG. 7 is a diagram illustrating a coaxial transmission line structure.

DETAILED DESCRIPTION OF THE INVENTION

The chips are available as a piece of substrate with the embedded circuits or can be provided as packaged devices. The purpose of the packaging is to protect the chip. One of the goals of the invention is to provide a method and a structure for encapsulation of the chip onto a package. The package can be made of several different materials such as plastic, plastic moldings, ceramic materials, etc.

Figure 1A:
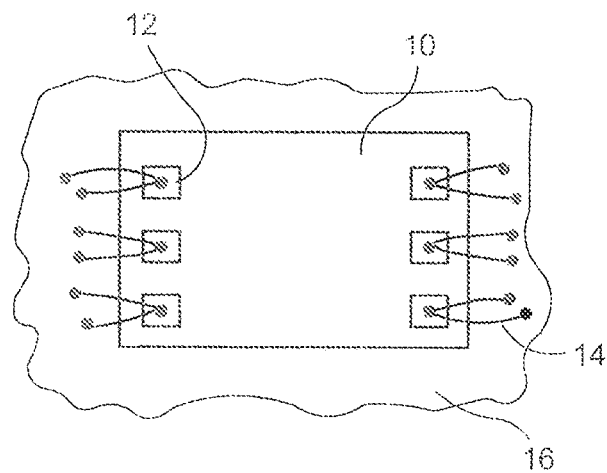
FIG. 1A is a diagram illustrating a wire bonding technology.

FIG. 1A illustrates a die 10 configured as a piece of semi-conductor material having input and output pads 12. The pads are metallic contacts that are left open in order to have either wire bonded on contacts or have a copper pillars/bumps installed onto those. Wire bonding and copper pillars/bumps are two available technologies for die attach processes which will be discussed below.

In FIG. 1A metal, gold for example, filaments 14 are used, with welding being applied to the filaments for attachment to the pads on the die 10 or PCB (printed circuit board) 16. Instead of the filaments/wires, a metal/gold ribbon can be used. Instead of having a very thin filament, a strip of metal/gold is used and can be attached also the pads. From the electronics perspective, use of thinner filaments or wires brings up higher inductances which need to be avoided. One method to avoid inductances is to use ribbons, so the strips are wider and the inductance goes down. Another option is to use several different wire bonds for the same pad. In this manner, parallel inductances are created, so the effective inductance will be less than the original one. These approaches are available on how to reduce the inductance of the die attach by employing the wire bonding technology.

Figure 1B:
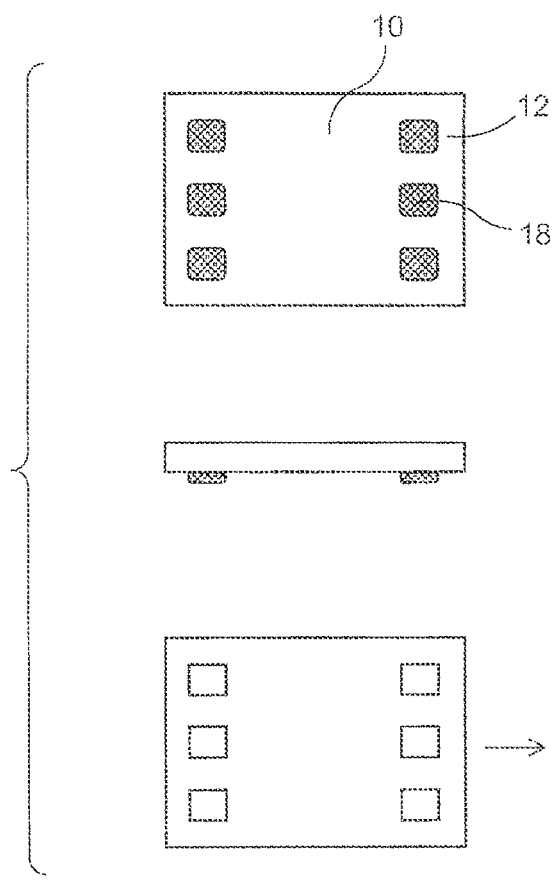
FIG. 1B is a diagram illustrating a flip chip technology.

We are referring now to FIG. 1B, wherein the second existing technology or copper pillars or bump die is illustrated. In the copper pillar technology, a die 10 having pads 12 is provided, instead of using wire bonds to attach the die to a PCB, copper bumps 18 are placed on the pads and the unit is flipped on the PCB. The bumps of the die are mounted on the matching landing pads of the PCB. Then, a re-flow process is applied, including application of high temperature, so that the copper bumps are melted and become attached to the landing pads on PCB. The above discussed technology of copper pillars bump die, is also known as flip chip technology, because of the action of flipping is used. In the flip chip technology, all the circuitry is placed at the bottom side of the semi-conductor to face the PCB.

Figure 2A:
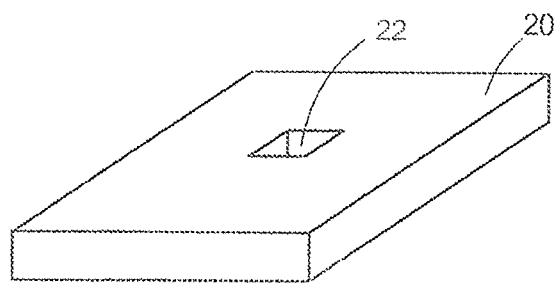
FIGS. 2A, 2B and 2C are diagrams illustrating how the die is attached to the actual package utilizing a wire bonding technology.
Figure 2B:
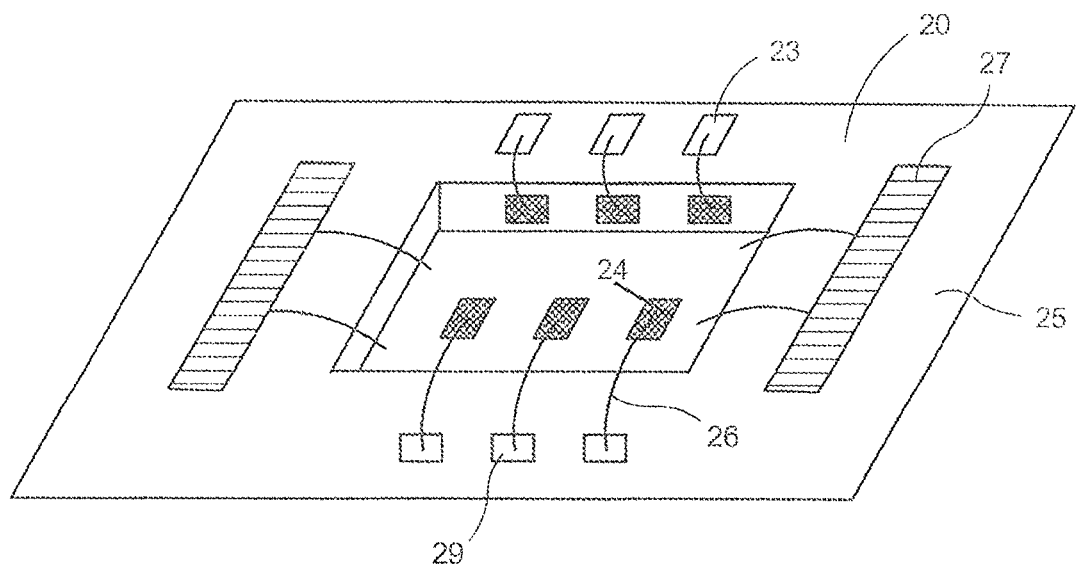
Figure 2C:
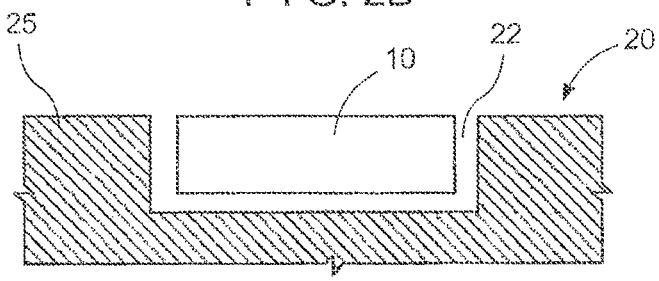

We are referring now to FIGS. 2A, 2B and 2C representing a detailed diagram illustrating how the die 10 is attached to the LTCC package utilizing exclusively the wire bonding approach. The general idea of this embodiment is to create LTCC package 20 with at least one cavity 22 formed at a top area thereof. In a wire bonding methodology of the invention, the depth of the cavity 22 should be exactly equal to the thickness of the die 10. In this manner, when the die is dropped/positioned into the cavity, it will be flush with the surface of the actual package. FIG. 2A illustrates LTCC package intended to be used for the wire bonding attachment. A mono block structure 20 is formed with a cavity 22 at the top surface having the depth substantially equal to thickness of the expected die 10 which will be dropped into the cavity. An essential aspect of the invention is to provide the die, which after being dropped into or positioned within the cavity, is disposed flush with the surface 25 of the package. This arrangement is illustrated in FIG. 2C, showing how the die 10 has been dropped into the cavity 22 of the package and is mounted flush with the top surface 25 of the package. The length of the wire bonding elements 26 is shortest when the die 10 is flush with the top surface 25 of the package—this is one of the essential aspects of the invention when the wire bonding approach is utilized. By reducing the length of the wire box, the inductance is also reduced.

Referring now to FIG. 2B illustrating the first step of the wire bonding technology, showing only the top surface 25 of the package and the way the die should be inserted into the cavity that has been created at the top surface. The pads can be printed on the top surface 25 of the LTCC package 20. The pads 24 can be of any shape and can be extended to traces within the package and can also represent ground planes 27 that are being brought up to the top surface as well. For instance, the traces can be traces of the ground planes to which ground planes on the die will be wire bonded to ground planes onto the package. The approach is applicable not only to the signal traces 29, but ground planes/traces 23 as well. An essential aspect of the FIG. 2B arrangement is that practically any kind of traces can be provided at top surface 25 of the LTCC package 20. Thus, the LTCC package of the invention is being used for accommodating arbitrary passive circuits. Thus, it is possible to add arbitrary traces to the top surface of the package in order to conform to the requirement the electrical performance. Furthermore, in the invention it is possible to mount at the top surface 25 of the package 20 components such as resistors, capacitors, inductors, diodes and in general, any other surface mountable devices including additional systems in package. In this manner, the invention creates integrated additional passive circuitry, such as matching networks, filters, power splitters, baluns, transformers and in general any type of passive components that add functionality to the set of packaged circuits, by incorporating those either at the surface level of the package or embedding them within the package's monolithic structure. The technology of implementing the packages by means of forming cavities 22 to drop dies 10 is resulted in shorter lengths of wire bonds 26 from the die to the package itself. This approach also enhances the flexibility of providing arbitrary circuits within the LTCC at the surface level of the package or embedding within the package's monolithic structure, and can be used for matching purposes or for input and output boards or for bringing up signal traces or ground traces to and from of the die.

Figure 3A:
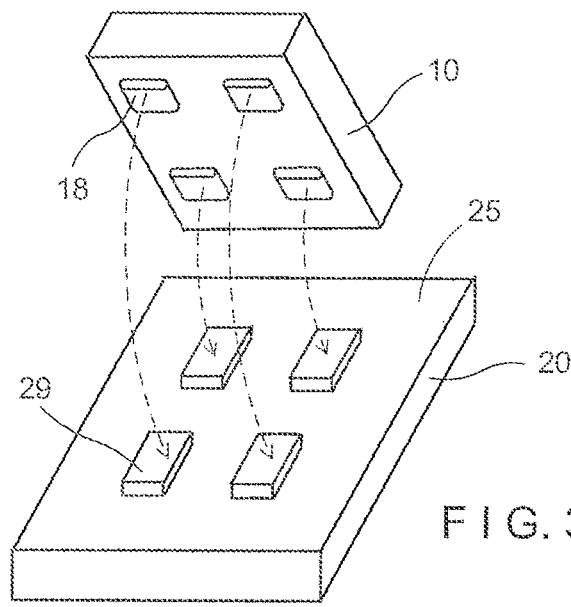
FIG. 3A is a diagram illustrating principles of the flip chip die attach technology.

Referring now to the diagram of FIG. 3A illustrating principles of the flip chip die attach technology. A die 10 having copper fillers/bumps 18 is adapted to be mounted facing down at the top surface 25 of the LTCC package 20 provided with the landing pads 29 corresponding to the bumps of the die.

Figure 3B:
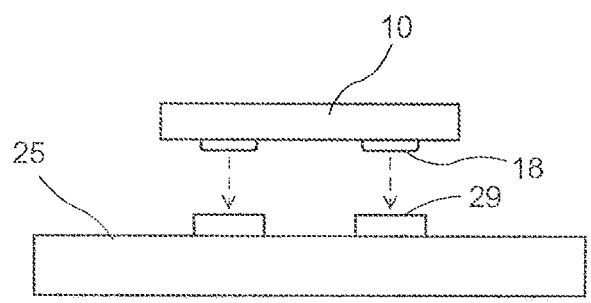
FIG. 3B is a diagram illustrating how the die attachment is accomplished in the flip chip technology.

Referring now to a cross-section diagram of FIG. 3B, which illustrates how the die attachment is accomplished in the flip chip technology. The die 10 having copper pillars or bumps 18 facing down is attached by placing on top of the metal contacts 29 provided on the top surface 25 of the LTCC package.

The package may include a multi-layered LTCC structure, and any type of pattern can be provided either at the top surface or embedded within the monolithic structure of the LTCC (also shown in FIG. 3A). An essential issue addressed and resolved by the invention is how to produce a structure capable of transferring energy back and forth between the die and the source. To accomplish this task the LTCC technology is utilized.

Figure 4:
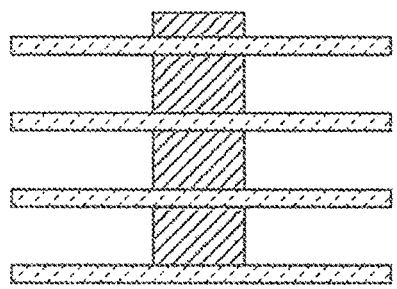
FIG. 4 is a diagram illustrating principles of LTCC technology.

FIG. 4 is provided to illustrate principles of LTCC technology. Co-fired ceramic devices are monolithic, ceramic microelectronic devices where the entire ceramic support structure and any conductive, resistive, and dielectric materials are fired in a kiln at the same time. Co-fired ceramic devices are made by processing several layers independently and assembling them into a device as a final step. This differs from semiconductor device fabrication, where layers are processed serially, i.e. each new layer is fabricated on top of the previous layers. Co-firing is typically divided into low temperature (LTCC) and high temperature (HTCC) applications: low temperature means that the sintering temperature is below 1,000° C. (1,830° F.), while high temperature is around 1,600° C. (2,910° F.).

In the present instance, LTCC application is the action of firing together a silver paste with a ceramic substrate material at the sintering temperature below 1000° C., enabling to laminate several different layers in the same process one on top of the other. Thus, a single monolithic structure is created having multiple embedded passive circuits. The package produced using LTCC technology is placed between a PCB (printed circuit board) and the actual die enabling to transfer energy back and forth therebetween.

An essential technological issue addressed by the invention is how to provide efficient transfer of energy between the PCB and the die without introducing parasitic.

Energy can be transported by several means. Either a simple wire or a transmission line can be used for this purpose. One example of the transmission line is a coaxial cable. Another example is a waveguide. Transmission lines can be used in many planar technologies such as micro strip, strip line, coplanar wave guide, etc. Another way for transmitting energy is by way of radiation, utilizing antennas.

We are referring now to FIG. 5 diagram. The energy is transferred vertically within the LTCC package. Because of the surface mount of a die in the package, the die is positioned at the top of the LCTC package (see FIG. 2). In the invention, the LTCC package serves as a vehicle for surface mounting the system namely, the die and the package are mounted on a PCB. The energy is transferred vertically between the PCB and the die.

In FIG. 5A, illustrates various approaches which can be employed to transfer the energy. The simplest approach is by employing wires or vias in LTCC structures. Another approach is to use transmissions lines. There are various alternatives on how to implement transmission lines.

Via or vias, also known as vertical interconnect access, is an electrical connection between layers in a physical electronic circuit that goes through the plane of one or more adjacent layers. For the purposes of the application, wires and vias have identical meaning. The difference between vias and transmission lines is one of the most essential aspects of the invention. A wire is typically made of a single conductor, namely copper or any conductive material.

FIG. 5C is an illustration of the transmission line which operates in TEM mode. Coaxial transmission line is an example of a TEM type of a transmission line. To form a TEM mode type of a transmission line, two conductors are needed. A noticeable difference between construction of a coaxial cable vs. the construction of a wire is in the number of conductors. In the coaxial cable, a central or internal conductor is surrounded by an external conductor, a dielectric fills the gap between the external conductor and the internal conductor. In FIG. 5C the hatched area illustrates how the dielectric, commonly Teflon, fills the gap between the external and internal conductors. These components are needed for TEM mode type of propagation in a coaxial cable.

FIG. 6 illustrates advantages of using a transmission line (for example a coaxial line or any of the TEM mode types of transmission lines) vs. implementing a wire for transmitting hi-frequency energy between two points.

An essential issue is the impedance, which is the effective resistance of an electric circuit or component to alternating current, arising from the combined effects of ohmic resistance and reactance. FIG. 6 presents the equation which is related to the impedance posed by an inductor. The higher the frequency passing through a wire, the higher the impedance, and the higher is the resistance to the flow of energy through it. This is an undesirable effect. If vias or wire structures at higher frequencies are used there will be higher resistance to the energy flow. Thus, due to the high impedance, wires or vias cannot be employed for hi-frequency transmission of energy between two points. Thus, it is beneficial to utilize the concept of employing transmission lines (as opposed to vias) to bring energy between the PCB and the die.

Since the performance of the coaxial cable type of transmission lines are quite satisfactory up to very hi-frequencies, it has been chosen to implement the coaxial cable type of transmission line to be embedded into the LTCC.

A coaxial cable typically consists of at least two conductors and a dielectric separating the conductors. A center conductor in the form of a via is provided vertically traversing the LTCC structure. Furthermore, the center conductor is surrounded by smaller vias closely spaced between each other. In this manner, an electrical boundary is developed to the wave of electrical electromagnetic energy. In actuality, a metallic shield is created around the center conductor by the peripheral or external vias. As illustrated in FIG. 7, these external vias are placed in a concentric circular fashion surrounding the internal via. The external via can be arranged in a variety of fashions, either circularly or rectangularly etc. There is a geometrical relationship between the characteristic impedance of a transmission line and the actual shape of the external vias used in the formation of the actual coaxial cable structure.

The characteristic impedance or surge impedance ($Z_0$) of a uniform transmission line is the ratio of the amplitudes of voltage and current of a single wave propagating along the line; that is, a wave travelling in one direction in the absence of reflections in the other direction. Characteristic impedance is determined by the geometry and materials of the transmission line.

Transmission lines are characterized by two parameters, namely the characteristic impedance (Zo) and the length. These two parameters define the physical implementation of a transmission line. Zo characteristic impedance is a constant if there are no lossless, meaning no losses caused by resisted losses, i.e. heating of the actual metal.

Certain geometry should be achieved that complies with an important characteristic impedance (Zo) defining the matching condition whenever an interface of two devices is encountered. A situation is needed where two devices are in contact with each other, wherein such devices should have identical characteristic impedance (the same exact value of Zo). In this situation, the entire power/energy delivered to a coaxial transmission line, will be transmitted to the die without any reflection of the energy back to the source. This matched condition is achieved by controlling the value of the characteristic impedance (Zo) of the transmission line. In the invention, the coaxial cable implemented within the LTCC structure is employed to deliver the power or electromagnetic energy from the bottom of the PCB end to the die end and vice versa.

Figure 8:
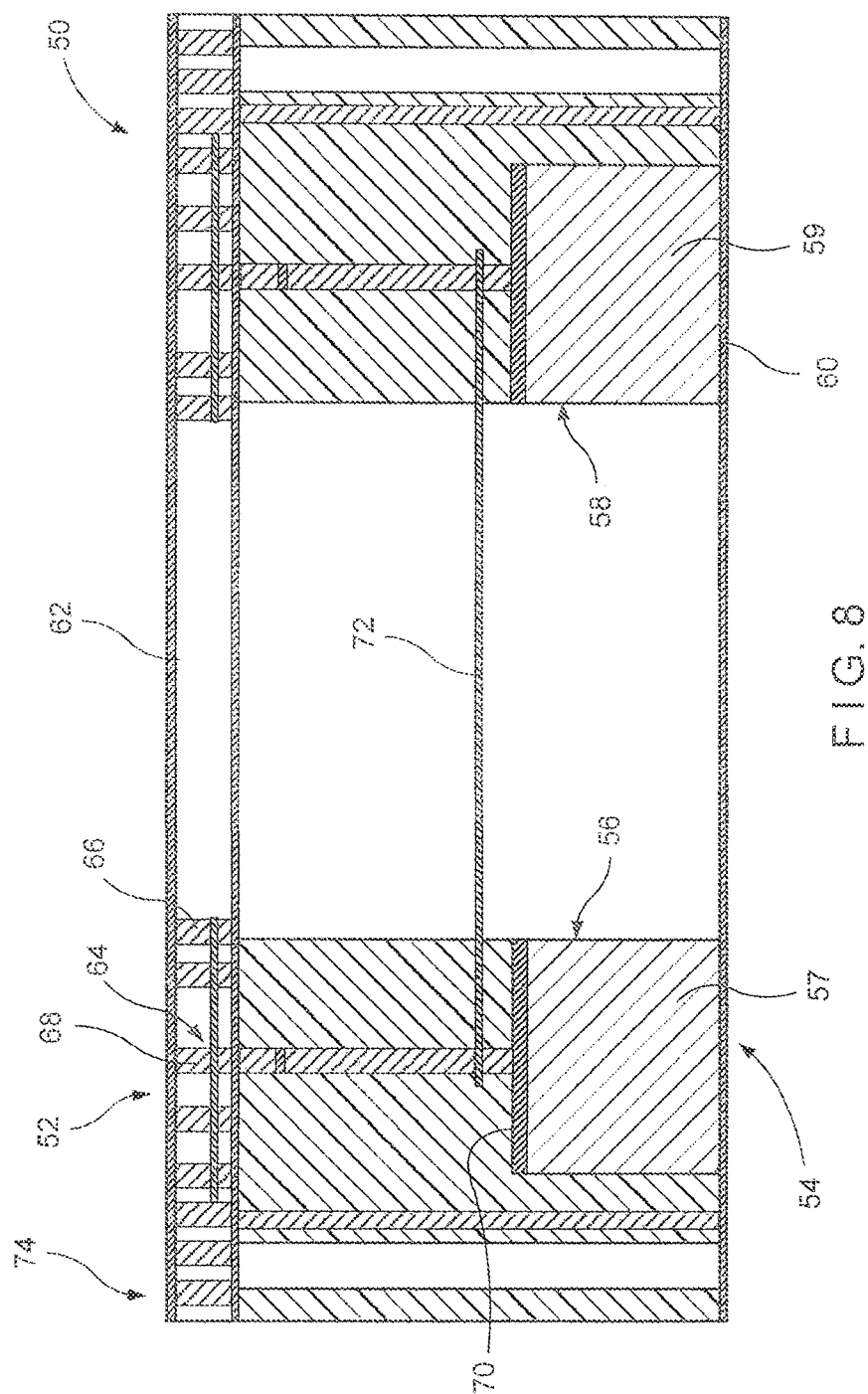
FIG. 8 is a diagram showing a cross-sectional view of the LTCC package of one embodiment of the invention depicted in the inverted position.

Referring now to FIG. 8 which is a cross-sectional view of one embodiment the LTCC package 50 of the invention, shown in the inverted position. In view of the inverted orientation, the upper portion of FIG. 8 illustrates the bottom area 52 of the package, which is connected/soldered or positioned on top of PCB (printed circuit board). In a similar manner, the lower portion of FIG. 8 represents the top area 54 of the LTCC package. It will be discussed below that the LTCC package 50 of the invention is flexible in the sense of enabling a user either to utilize a wire bond attachment technology or a flip chip type of a die attach.

As illustrated in FIG. 8, two cavities 56,58 are provided within the LTCC structure/package extending from the top surface 60 inwardly or in the direction of the bottom surface 62, to accommodate the respective components. When flip chip approach is utilized, the dimensions of the cavities 56,58 are determined by the desired formation of the flip chip version of the respective dies 57 and 59 and by the needs to lower the impact of parasitic stray capacitances. Each flip chip die 57,59 is dropped into the respective cavity facing down, with the bottom of the chip containing copper pillars or bumps facing the interior of the cavity. The soldering process is then carried out by a re-flow process which is totally compatible with the flip chip technology.

This method is modified for a wire bond approach, when the contacts of the die are wire bonded to the top surface of the package 60. The depth of each cavity 56,58 formed in the LTCC package is substantially equal to the thickness of the respective die. In this manner, when the die is dropped into the cavity, it will be flush with the top surface of the actual package, as previously discussed with reference to the embodiment of FIG. 2. This is an essential aspect of the invention. In the wire bonding attachment, the length of the wire box will be shortest, since the die is flush with the surface of the package. By reducing the length of the wire box, the inductance in the arrangement of the invention is also reduced.

An essential aspect of the above discussed arrangement is that practically any kind of traces can be provided at the top surface 60 of the package or being embedded within the monolithic structure of the LTCC package in the wire bonding approach. Thus, the LTCC package 50 of the invention can be used for accommodating arbitrary passive circuits. In the invention, it is possible to mount at the top surface 60 of the package components such as resistors, capacitors, inductors, diodes and in general, any other surface mountable device including additional systems in package. In this manner, the invention creates a plurality of integrated passive circuits both, at the surface of or embedded within the LTCC. This approach can be used for various purposes, including matching, filtering, powers splitting, bringing up signal traces or ground traces to and from a die, among others.

In the embodiment of the invention, adapted for the application of another aspect of the flip chip technology, there is no need for the cavities to be formed. As previously discussed regarding FIGS. 1B and 3A, 3B, the flip chip die having pillars or bumps facing down is attached by placing directly on top of the metal contacts provided on the top surface 60 of the LTCC package.

As illustrated in FIG. 8, the bottom surface 62 of the package forms an interface between the LTCC package and the PCB. The interface employs either one or both structures, namely CPW (coplanar waveguide structure) 74 and/ or the coaxial structure 64. In the invention either both structures or one of the structures can be employed at the interface, while the LTCC package is mounted on top of a PCB.

A cross-section of the coplanar waveguide structure 74 is shown at the top part of FIG. 8, followed by the coaxial structure 64. The bottom surface 62 of the package is attached/soldered or positioned on top of PCB (printed circuit board).

As illustrated in FIG. 8 the coaxial cable structure 64 extends from the bottom surface 62 of the package to vertically traverse the LTCC package. The essential function of the coaxial cable structure 64 is to bring EM energy back and forth between PCB and the dies 57,59 disposed within the cavities 56,58. The set of external vias 66 is provided extending from the bottom surface 62 and defining the external conductor of the coaxial cable. In a similar fashion, the center via 68 defining the center conductor of the coaxial structure 64 extends from the bottom surface 62.

To assemble the coaxial structure 64, the center conductor should be separated from the outer conductor by a dielectric material. In this embodiment of the invention this is accomplished by having the external conductor, formed by the set of external conductors or vias 66, to be embedded into a LTCC substrate operating as the dielectric. The center conductor 68 made of a metal (silver for example) is utilized to transport the signal coming from or going to the die.

Vias define both the multiple external conductors 66 and the internal conductor 68 of the coaxial structure 64. In the embodiment illustrated in FIG. 8, only the external conductor or the external vias 66 extend through the entire LTCC package from the bottom surface 62 to the top surface 60. The internal via 68, which represents the center conductor of the coaxial structure, extends from the bottom surface 62 only up to a certain area within the package. This is the area that is bound by a die metal contact or a pad 70 provided at an inner end of the respective die. The pad 70 forms an electrical interface, providing an electrical contact between the die disposed within the respective cavity and the actual LTCC package.

The invention is not limited only to the above discussed coaxial structure. In the LTCC package of the invention, a coaxial feed can be employed to transfer electromagnetic energy vertically from the interface between the LTCC structure and PCB to a certain area within the LTCC structure. This can be an area accommodating the embedded components such as layouts of passive components or an area accommodating the contact pads of a die dropped into receiving cavities formed within the LTCC structure.

The package 50 of the invention provides the flexibility to interconnect internally within the LTCC structure two or more dies 57,59 that have been placed within the cavities 56,58 of the package. In this application, a user has the capability of packaging multiple dies in the same package. It should be noted that further interconnection of the dies and making actual circuits between the dies are contemplated by the invention. The method of the invention also enables a user to have simple transmission lines embedded in the strip line fashion on the LTCC and to provide additional passive circuitry, such as matching networks, filters, power splitters, baluns, transformers and in general any type of passive components that add functionality to the set of package circuits between the dies of the LTCC. There is a substantial range of possibilities on the level of integration that can be achieved with the above-discussed package of the invention.

Surface 72 (strip line) is an example of how two dies 57 and 59 can be interconnected internally with an embedded interconnection onto the LTCC substrate. It should be noted that this embedded interconnection is a transmission line type of interconnection. Therefore, a high-quality interconnection having low losses between multiple dies is provided accompanied by a low parasitic and low inductance between the interconnects allowing us to push further in frequency and reaching the millimeter wave spectrum.

FIG. 8 shows the interconnected two modules of the invention wherein dies 57 and 58 are dropped to be interconnected in a certain desired fashion. The interconnection is being embedded/integrated within the LTCC multi-layer structure. The invention takes advantage of the technology of the multi-layer fashion approach to embed passive circuits that will be serving a purpose to filter or to split energy or basically interconnect several different dies that can be dropped into the cut outs that will be designed and of standard sizes for the dies encountered in the market.

Figure 9:
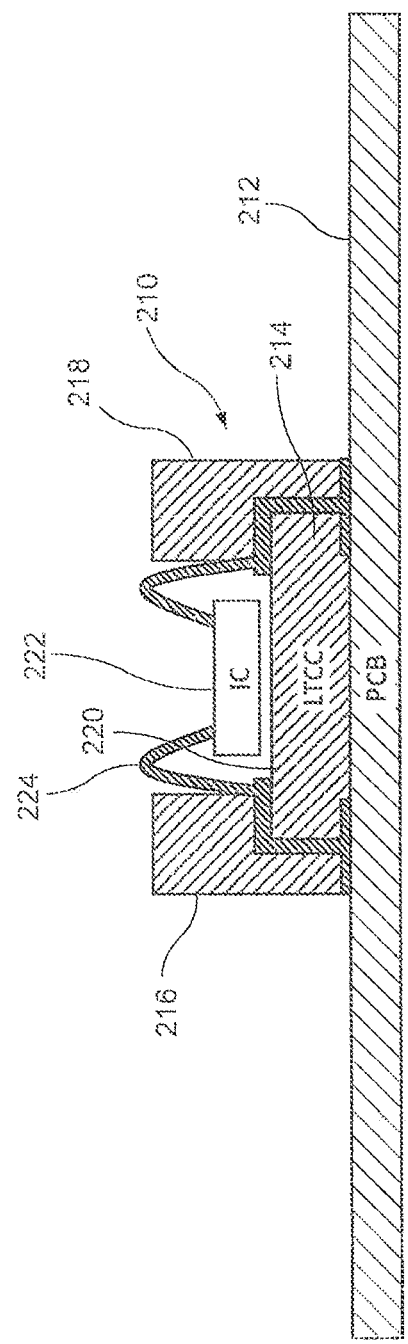
FIG. 9 is a schematic diagram of another embodiment of the invention.

Referring now to FIG. 9 which is a schematic diagram of another embodiment of the invention. LTCC package 210 is provided at the top surface/area 212 of PCB, forming an interface therebetween for the energy transfer in a vertical manner. LTCC structure or a soft substrate is formed by a bottom portion 214, which can be provided with or without walls 216 and 218 extending substantially vertically therefrom. It will be discussed later in the application, that when the walls are not built-in, a non-flat plastic or ceramic molded lid can be employed, forming an internal dome providing clearance to wire bonds 224 utilized for connection between an integrated circuit 222 and the package. The walls are separated from each other forming a cavity 220 adapted to receive the integrated circuit 222, so that by dropping the integrated circuit into the cavity, an air cavity package is formed. However, as discussed later in the application, in the embodiment where no cavity is built, the integrated circuit is provided on top surface of the package, and a molded cover or lid is employed to form an air cavity package. LTCC package is provided at the top surface/area of PCB, forming an interface therebetween for the energy transfer in a vertical manner. To improve electrical performance at the interface between a die (a block of semiconducting material on which circuit is fabricated) or an integrated circuit positioned within the cavity and the actual package structure, the energy is vertically transferred by means of a transfer arrangement utilizing circuitry embedded within layers of the LTCC. In this manner, performance of the integrated circuit can be matched with performance of the actual package.

In the illustrated embodiment the transfer arrangement is a coaxial structure, which can be in the form of coaxial cables or coaxial transmission lines embedded within the LTCC package. In one embodiment of the invention wire bonds 224, which are typically filaments of gold or can be made any conductive material, are provided interconnecting LTCC with the integrated circuit. It should be noted that other types of the transfer arrangement are within the scope of the invention. It will be discussed in greater detail below that in another embodiment of the invention, instead of employing wire bonds, 3D printed transmission lines/connectors are used to interconnect the LTCC structure with the integrated circuit. It should be obvious that this application of 3D printing technology is not limited to interconnection of integrated circuits with LTCC packages and is applicable in a variety of other applications to interconnect any surfaces or components.

Figure 10:
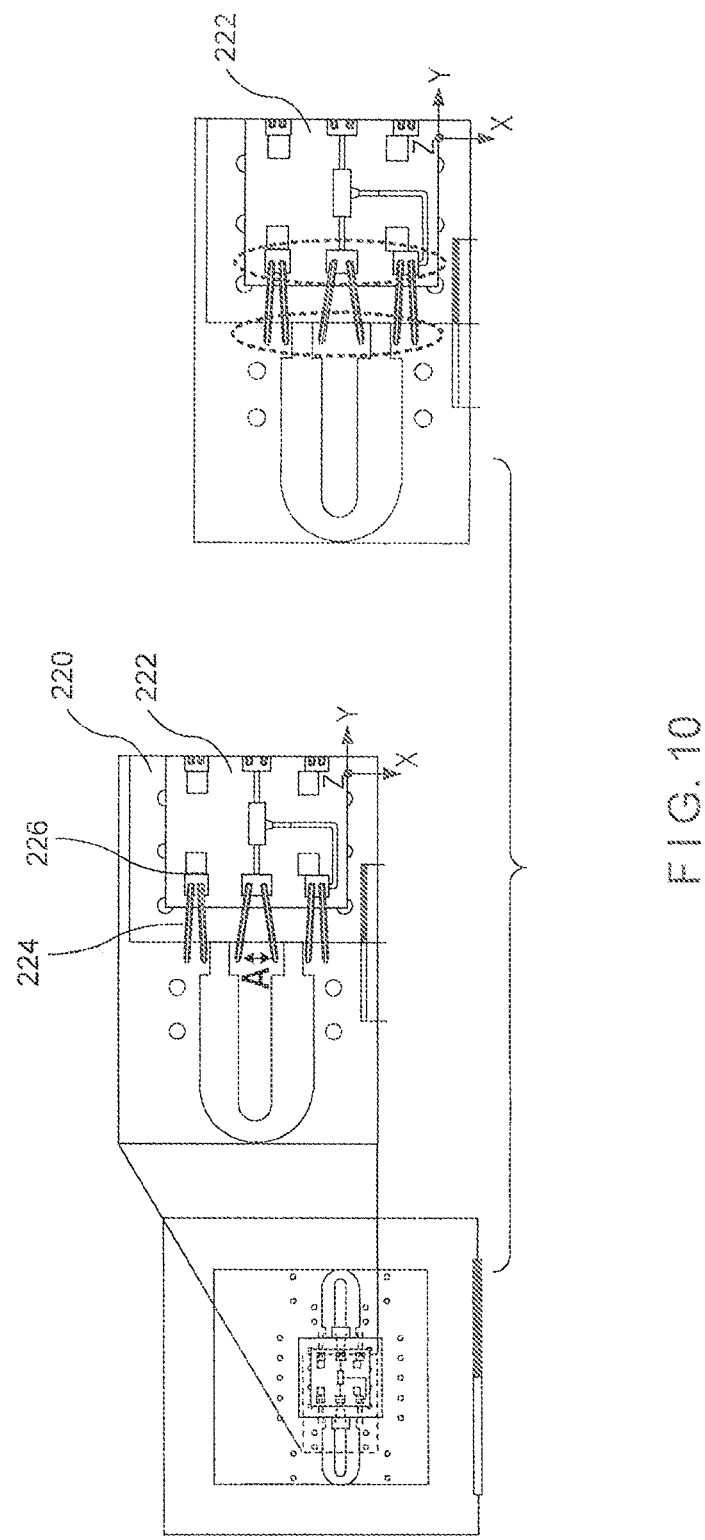
FIG. 10 is a is a top view illustrating details of an interface between an integrated circuit and LTCC.

Referring now to FIG. 10, which is a top view illustrating details of the interface between the integrated circuit 222 and LTCC. As the die 222 has been dropped into and or positioned within the cavity 220, a bottom portion of the die 222 disposed at an upper surface of the cavity is connected to a conductive region in the package. This can be accomplished by means of a conductive epoxy or any other glue. In a wirebond approach, only a bottom of the die is attached by a conductive epoxy to the package structure. The wire bonds are attached by means of a special wirebonding process. In flip-chip assemblies, discussed later in the application, the attachment between die and package is either performed by a special process or through a conductive epoxy. Conductive pads provided 226 at a top area of the die are used to wire bond and interconnect the die with the actual the package. Although, a wire bonding technique has been illustrated for connection between the integrated circuit 222 and the LTCC package 220, it should be clear that various of other technologies, such as for example, 3D printing, etc. can be used for interconnection between the integrated circuit and the LTCC package.

Figure 11A:
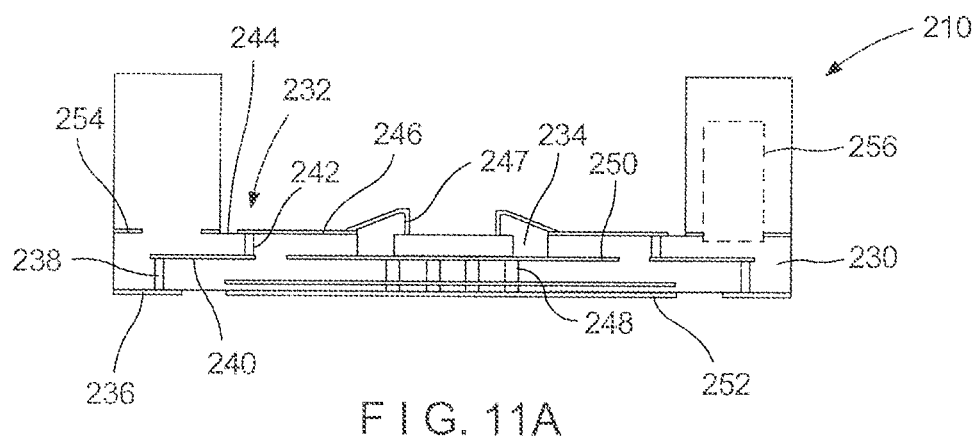
FIG. 11A is a cross-section view illustrating a package-integrated circuit interface according to further embodiment of the invention.

Referring now to FIG. 11A, which is a cross-section view illustrating a package-integrated circuit interface according to another embodiment of the invention of the invention. LTCC package 210 is formed by a bottom portion 230 with vertical walls 216,218 separated from each other. In the invention the package can be formed with and without walls. As previously discussed, if vertical walls are not formed, a lid with an internal dome accommodating an internal clearance of the wire bonds can be provided. In the illustrated embodiment there are two cavities formed in a space between the walls. A main cavity 232 extends between a base surface at a lower area thereof and top portions of the walls. A receiving cavity 234 extends downwardly from the base surface and is adapted to receive an integrated circuit 222, in the alternative the die or the integrated circuit is dropped into the receiving cavity 234. It should be noted that LTCC package without the cavity is within the scope of the invention.

From the package pads 236 forming an interface between the package and the PCB mother board energy is transferred upwardly through the coaxial arrangements 238 to the horizontally disposed strip lines 238/240 or any other transmission line type structures provided at the intermediary level. This is an embedded matching network embedded onto the LTCC. The energy is then directed to another vertically oriented coaxial structure 242 providing connection to the base surface of the main cavity. As further illustrated n FIG. 11, a top conductive layer 246 of the package is provided at the base surface 244, where the wire bond 247 is landed making interconnection between the package structure and the integrated circuit structure.

As depicted in FIG. 11, multiple conductive pillars or vias 248 are provided at a central area of the LTCC package to connect the ground plane or the ground pad 250 at the bottom portion of the integrated circuit with the ground plane or ground pad 252 at the bottom portion of the package. The conductive vias 248 perform two important functions. They dissipate heat away from the integrated circuit by means of conduction and also connect the ground plane of the package with the ground plane of the integrated circuit. This ultimately increases the power handling capacity and overall RF performance of the device.

FIG. 11 also shows that extra circuitry 254 is imbedded within the monolithic structure of a LTCC package or within a multi-layer formation based on an organic PCB. This extra circuitry improves the matching effects of the package itself.

Hollow pockets 256 are formed within the vertical walls of the main cavity or anywhere else in the package, to minimize parasitic capacitance effect. These hollow pockets enable the invention to counteract the parasitic capacitance developed at junctions of the transitions of each conductive segment of this package. This feature of the invention will be discussed in greater detail later in the application.

Figure 11B:
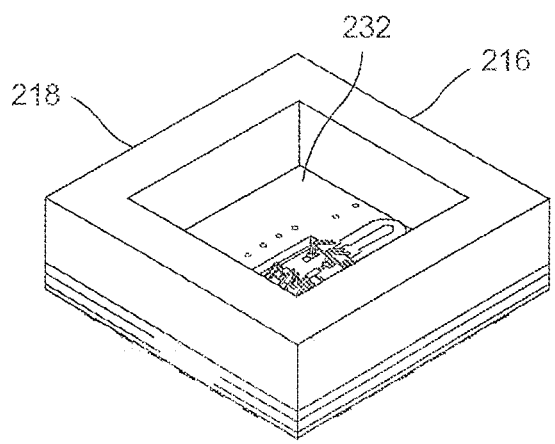
FIG. 11B is an isometric view of the LTCC package of the invention.

Reference is made to FIG. 11B showing an isometric view of the LTCC package of the invention, which is formed by four vertically extending walls 216,218 depicted as vertical rectangles extending from the base and surrounding the cavity 232. The walls are formed having substantial thickness, with the interior of the walls surrounding the structure being capable of accommodating hollow air pockets thereinside. Top area of the walls supports a cover (not shown) provided to seal the package.

In the alternate embodiment, the walls are eliminated, and a cover is positioned on top of the base element. The cover is formed with an upwardly extending recess provided to accommodate air cavity and to accommodate the interconnections of the integrated circuit. The cover is made of any suitable material, including, but not limited to ceramic, plastic. etc.

Figure 12:
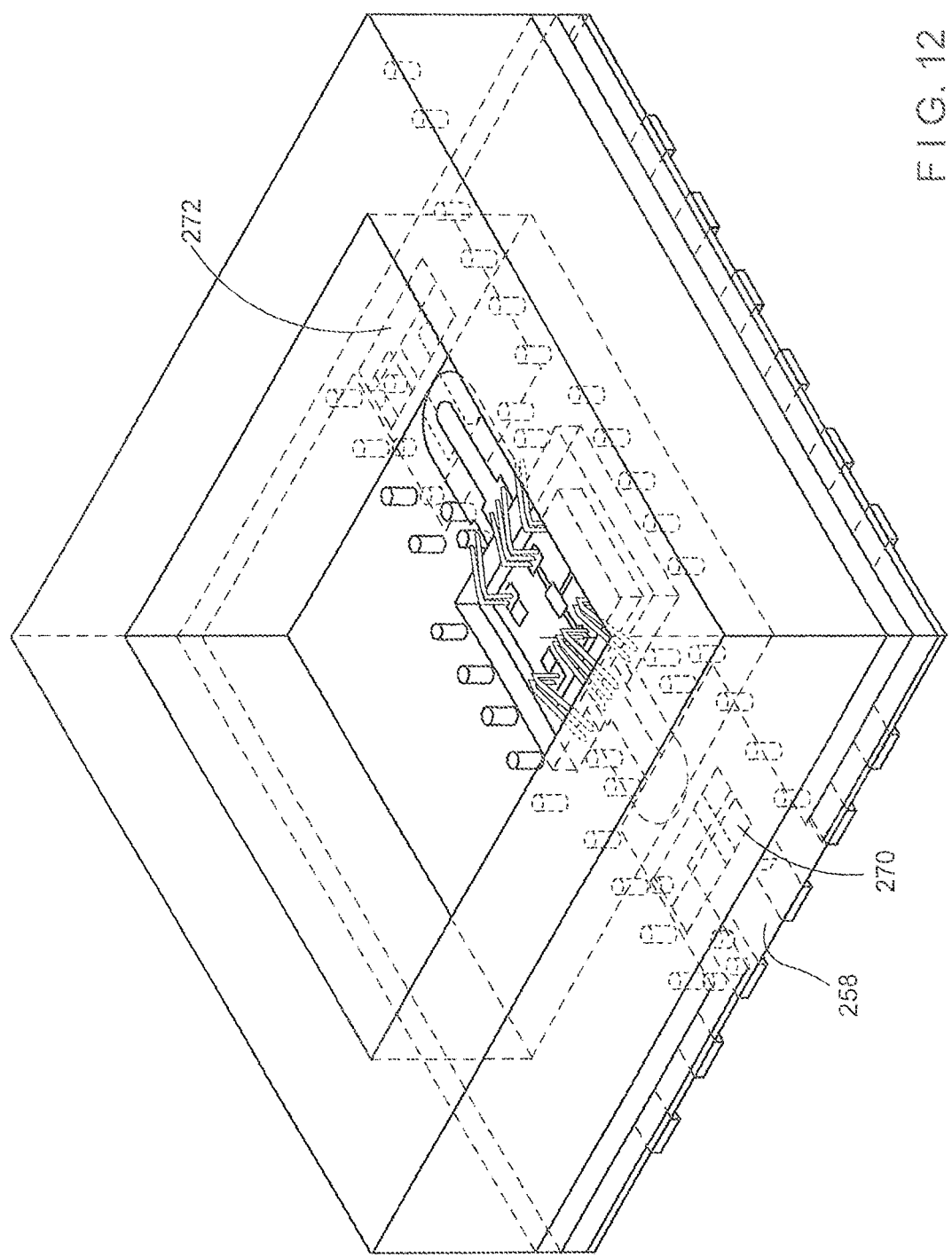
FIG. 12 is an isometric view illustrating interface of the device of the invention.

Referring now to FIG. 12 which is an isometric view illustrating interface of the device of the invention. A pad 258 is provided at the bottom portion of the package providing the interfacing contact with the previously discussed mother board PCB. An upwardly extending via is surrounded by adjacent vias (not totally sown) creating a coaxial structure. Then, the coaxial structure is converted into a horizontally oriented strip line structure. From there the connection is again directed upwardly in the coaxial fashion. Finally, we mate everything in with a co-planer wave guide which is wire bonded to the die. From bottom to top of FIG. 12 diagram the sequence the signal trace is from the coaxial arrangement to strip line, back to the coaxial arrangement, then to co-planer wave guide structure, and terminating at the wire bonds.

In the invention the energy is transferred from the bottom portion of the package to the top portion, where the integrated circuit is placed, and back from the integrated circuit down to the bottom portion of the package. In order to achieve the effective transfer of energy, transmission lines and the shortest possible wire bonds are utilized. In view of the resistance, to minimize losses, it is essential to make the wire bonds as short as possible. For this purpose, in the previously discussed embodiments the die is dropped to the small receiving cavity. In this arrangement the length of wire bonds is minimized. That is the purpose of having a cavity and having the integrated circuit dropped. In the invention to form the entire integrated transmission line structure, the wire bonds (which are the only non-transmission line type arrangement) are replaced with 3D printed transmission line connectors/structures. In this approach the entire structure is advantageously interconnected by means of transmission lines.

Figure 13:
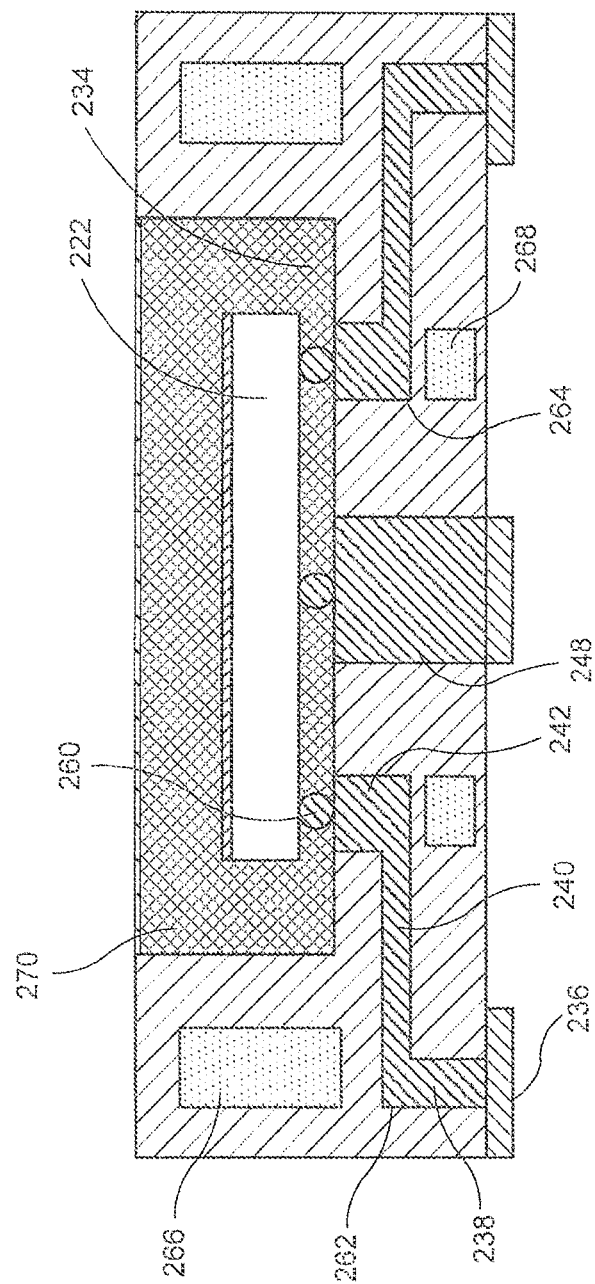
FIG. 13 is a cross-section view of still another embodiment of the LTCC package of the invention.

We are referring now to FIG. 13 illustrating a cross-section view of another embodiment of the package of the invention. In a manner previously disused, from the package pads 236 provided at the bottom level energy is transferred upwardly through the coaxial arrangement 238 to the horizontally disposed strip lines 240 provided at the intermediary/second level, between the bottom of the package and the integrated circuit level positioned above. Various components, such as inductors, capacitors, transmissions lines, matching components can be provided at this area of LTCC package. From the strip line energy is directed to another vertically oriented coaxial structure 238/242 providing connection/merging to a bottom surface of the receiving cavity 234 where the integrated circuit 222 is placed.

The flip chip aspect of the invention illustrated in FIG. 13 shows interconnects 260 positioned at the bottom of the integrated circuit 222. In this manner, the bottom of the integrated circuit with the respective interconnects is connected to the bottom of the receiving cavity 234. The interconnects 260 can be in the form of solder bumps, a gold to gold interfaces (GGI interfaces) or any other mechanisms used in the industry for interfacing flipped chips. In the illustrated embodiment interconnection between the integrated circuit and the LTCC package is achieved by means of solder bumps. In this flip chip approach, the interconnects 260 are positioned at the bottom of the integrated circuit, and the need for wire bonds is eliminated. In the previous approaches the interconnects are positioned at the top and the wire bonds are needed.

It is known that undesirable parasitic capacitance effect is developed at sharp corners junction between the vertical and horizontal lines which are known in physics as high charge density locations. In the arrangement illustrated in FIG. 13, such high charge density locations/higher capacitance points are at a junction 262 between the vertically oriented coaxial arrangements to the horizontally disposed strip lines. In the illustrated embodiment, to provide relieve from the parasitic capacitance, air cavities or air bubbles are provided on top and below each such junction. For example, the air cavities 266 are developed on both sides of the LTCC package above the sharp corner junctions between the vertically oriented coaxial arrangement provided at the bottom level and the horizontally oriented strip line at the intermediate level. The air cavities 268 are also developed on both sides of the LTCC package below the sharp corner junctions between the vertically oriented coaxial arrangement provided at the top level and the horizontally oriented strip line at the intermediate level.

The diagram of FIG. 12 shows bottom and intermediate and the top levels of the structure. Referring now to air pockets 270 illustrated in FIG. 12 which extend between at least two levels and disposed on both sides of the package. The air pockets are located above the junction between the horizontal lines positioned at the bottom level and another horizontal lines positioned at an intermediate level above, so as to extend between the middle and the bottom levels.

Multiple conductive pillars or vias 248 are provided at a central area of the LTCC package of FIG. 13. Similar to the above-discussed embodiments, these conductive vias dissipate heat from the integrated circuit by means of conduction and also transfer the ground plane of the package to the actual integrated circuit.

In the embodiment of FIG. 13 the vertical walls of the package are eliminated, and the integrated circuit can be covered by placing a cover, an actual lid on top surrounding the structure. In an alternate embodiment, a resin-type substance 270 is deposited/conforming around the integrated circuit and will be cured and solidified. A thin film can be used on top of the IC to cover it.

Figure 14:
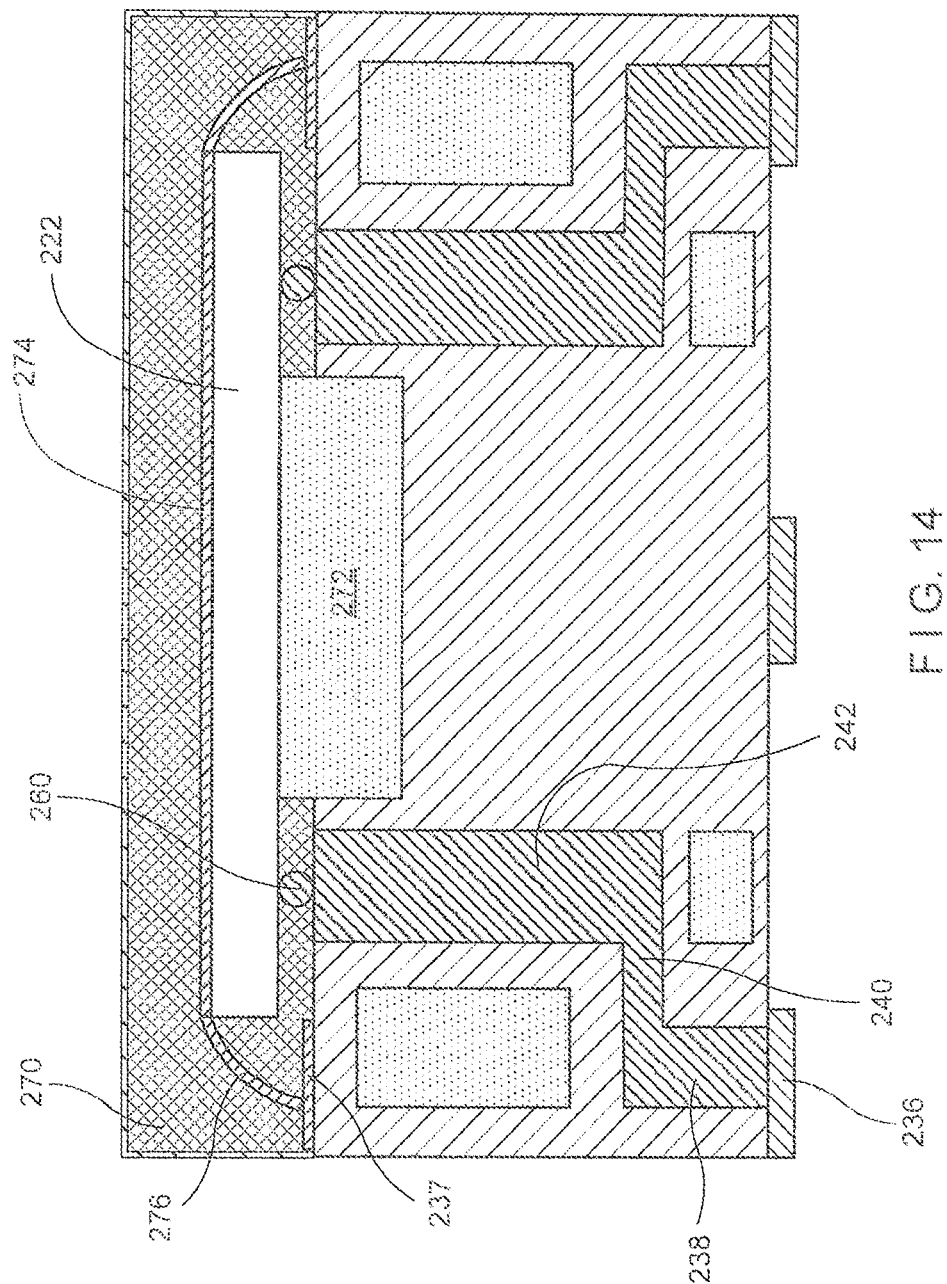
FIG. 14 is a cross-section view of still further embodiment of the LTCC package of the invention.

The embodiment illustrated in FIG. 14 represents a suspended integrated circuit/die, which is placed on the top surface of the LTCC substrate. Due to the absence of the cavity, which is present in the embodiment of FIG. 13, the integrated circuit 222 is positioned on top of the solid structure. A substantial air pocket 272 is formed within the LTCC structure below the integrated circuit. In the application of the flip chip technology illustrated in FIG. 13, upon flipping the integrated circuit, functionality of the circuitry is often affected by parasitics developed due to the close proximity with the LTCC substrate. The proximity of LTCC substrate with signal traces of the integrated circuit results in parasitics, which interfere with the integrated circuit performance.

In the embodiment of FIG. 14 the air pocket 272 underneath the integrated circuit 222 separates the integrated circuit from the substrate, minimizes parasitic and ultimately provides a relief to the signal traces in the integrate circuit. The interconnects/bumps 260 provide the connection/interface between the integrated circuit and the LTCC structure and are similar to that of FIG. 13 embodiment. In the embodiment of FIG. 14 a molded lid can be also positioned on top of the upwardly extending integrated circuit and is formed with a recess accommodating such circuit. Alternately, the top of the entire structure can be covered by a resin-type substance 270, which when solidified creates a coherent unit between all the elements including the integrated circuit and the rest of the structure. The cover can be made of plastic, ceramic, molded material, etc. In the alternate approach a conforming resin or conforming thin film is used to cover the device.

In the wire bond approach of FIG. 11A, the signal traces extend upwardly and away from the package. The bottom portion/plane of the integrated circuit contains a metal conductor that carries the ground plane for the chip of the integrated circuit. This conductor is in direct contact with the metal ground plane of the package. Thus, in the wire bond approach, since the plane which contains the ground of the integrated circuit is positioned in direct contact with the package, the average distance to the ground is minimal.

In the flip chip approach of FIG of FIG. 14, since the dye is flipped, with the bumps or interconnects 260 facing LTCC package, the ground plane of the dye 274 is spaced from the package and faces upward direction. On the other hand, internal vias of the integrated circuit are used to make interconnection between the ground plane of the package and the ground plane 274 of the integrated circuit. This intermediate vias are used to connect the package ground plane to the top surface/portion of the integrated circuit, which carries the respective ground plane. Signal or ground package pads 236 are provided at the bottom level of the LTCC substrate, forming an interface between the package and the PCB mother board. From the package pads energy is transferred upwardly through the coaxial arrangement 238 to the horizontally disposed strip lines or any other transmission line type structure 240 provided at the intermediary level. The energy is then directed to another vertically oriented coaxial structure 242 providing connection to the integrated circuit region. In the embodiment of FIG. 13 the ground plane surface of the integrated circuit is separated from the package and is connected to the ground plane of the package through vias embedded into the integrated circuit.

In the embodiment of FIG. 14 there are two ground planes provided. In the integrated circuit, the ground plane 274 is located at the top portion thereof facing away from LTCC substrate. In the LTCC package one portion of the ground plane 236 is positioned at the bottom level, which through the internal circuitry is connected to the other portion 237 located at the top surface of the package. In the preferred embodiment flexible 3D printed substrate 276 is used to make the connection between the ground plane of integrated circuit and the ground plane/pad of the LTCC package. In this embodiment a conformal printing of the ground plane of the package to the ground plane surface of the integrated circuit is achieved by means of a 3D printing process. A potential wire bonding technique is not totally applicable, since application of the conforming resin substance on top of the die may cause distraction of the wire bonds. This makes use of a lid or molded cover as a preferred way of enclosing the arrangement with an integrated circuit. This is the preferred approach if the wirebonding technology is chosen for connecting the ground planes of the flipped chip assembly.

Use of heat stable/resistant 3D printed conductors 276, as illustrated in FIG. 14, to connect the package ground plane to the integrated circuit ground plane positioned at the top surface of the integrated circuit, makes it possible to use molded resin 270 or thin film to form the enclosure. As temperature rises, wire bond connections can be destroyed. On the other hand, heat resistant 3D printed substrates 276 are capable of withstanding elevated temperatures and can be better integrated into the melted resin composition. Thus, the issue of minimizing the distance between the ground plane of the chip and the packages ground plane of the package is resolved in the embodiment of FIG. 14.

The LTCC package of the invention can incorporate additional circuits for improving performance of a die which has been attached to the package or adding functionality to the die. The inventive package has a faculty for creating a system in package, including a set of integrated circuits enclosed in the package, wherein the set of circuits performs as the entire system. In the invention, the system in package is arranged by connecting a set of dies utilizing wire bonding or flip chip technologies.

The invention provides a high performing, cost effective millimeter wave LTCC package. The benefit of this invention is that it allows for a high degree of integration between dies and adds extra functionality to the actual die that has been dropped into the package. This is because the invention contemplates embedding within this entire module a receiver or transmitter for millimeter waves. We can integrate within this package mixers, low noise and power amplifier chips, LTCC filters embedded among others into the substrate. This brings a whole new level of integration at low cost and very high performance. It is possible to take the best performing agents of the available technologies, and create a multi-technology module whereas it will perform at the same level or even a better level than currently available integrated modules relying on a single technology.

What is claimed is:

1. LTCC (low temperature co-fired ceramic) package comprising:
   the LTCC package extending between package top and package bottom surfaces, PCB (printed circuit board) provided at the bottom surface;
   at least one cavity formed within the LTCC package extending from the top surface inwardly in direction of the bottom surface;
   the die type chip being disposed entirely within the cavity;
   a connection formed between the die type chip and the top surface of the LTCC package by wire bonding elements, so that length of wire bonding elements is minimized ultimately reducing inductance;
   an electrical interface formed between the PCB and the LTCC package, wherein said interface is selected from the group including a coplanar waveguide arrangement and a coaxial arrangement; and
   contact pads and traces are provided at the top surface and/or embedded within a body of the LTCC package to accommodate supplemental passive surface mountable devices and/or circuits, said surface mountable devices are additional systems in package.

2. The LTCC package of claim 1, wherein said surface mountable devices are selected from the group including resistors, capacitors, inductors and diodes.

3. The LTCC package of claim 1, wherein said surface mountable devices are selected from the group consisting of matching networks, filters, power splitters, baluns, and transformers.

4. LTCC package of claim 1, wherein a plurality of vias defining multiple external conductors and an internal conductor are provided.

5. The LTCC package of claim 1, wherein electromagnetic energy is transmitted by said coaxial arrangement from said electrical interface to a predetermined area within the LTCC package.

6. The LTCC package of claim 5, wherein said predetermined area within the LTCC package accommodates embedded passive components.

7. The LTCC package of claim 5, wherein said predetermined area accommodates contact pads of the die type chip disposed within said cavity.

8. The LTCC package of claim 1, wherein the coplanar waveguide arrangement comprises first and second ground planes separated by a gap, an internal signal conductor is disposed within the gap filled by a dielectric material.

9. The LTCC package of claim 8, wherein said dielectric material is selected from the group including air, a portion of the LTCC package and Teflon.

10. The LTCC package of claim 4, wherein the external conductors extend through the LTCC package from the bottom surface to the top surface, the internal conductor extends from the bottom surface of the LTCC package to a contact pad provided at an inner end of the die disposed within the respective cavity providing an electrical contact between the die and the LTCC package.

11. LTCC (low temperature co-fired ceramic) package comprising:
    said LTCC package extending between top and bottom surfaces,
    at least one cavity formed within the LTCC package extending from the top surface inwardly in the direction of the bottom surface;
    a die type chip having first and second outer surfaces, metallization bumps provided at said die type chip at one of said outer surfaces,
    the die type chip disposed entirely within said at least one cavity with the metallization bumps facing an interior of the cavity, the metallization bumps connected to an interior of the cavity;
    an energy transfer arrangement including a first substantially vertically oriented coaxial arrangement at the bottom surface and a second substantially vertically oriented coaxial arrangement connected to said least one cavity, with said first and second coaxial arrangements being bridged by a substantially horizontally oriented strip line; and
    hollow air cavities formed at a junction between said first substantially vertically oriented coaxial arrangement and said substantially horizontally oriented strip line and at a junction between the horizontally oriented strip line and said second vertically oriented coaxial arrangement, said hollow air cavities are adapted to provide relieve from parasitic capacitance.

12. LTCC (low temperature co-fired ceramic) package comprising:
   said LTCC package extending between package top and package bottom surfaces;
   a die type chip having first and second surfaces positioned opposite to each other, and having metallization bumps at the first surface thereof, the die type chip having a ground plane located at the second surface and facing away from the LTCC package, the LTCC package having a ground plane located at said top surface;
   the die type chip mounted at the top surface of the LTCC package with the metallization bumps facing the package, the metallization bumps being attached to the top surface of the package; and
   a connection formed between the ground plane of the die type chip and the ground plane of the LTCC package;
   whereby said connection is formed by conformal printing of the ground plane of the package to the ground plane of the die type chip by means of a 3D printing process.

* * * * *